United States Patent
Kato et al.

(10) Patent No.: US 8,648,350 B2
(45) Date of Patent: Feb. 11, 2014

(54) GALLIUM NITRIDE COMPOUND SEMICONDUCTOR LIGHT-EMITTING DEVICE

(75) Inventors: Ryou Kato, Osaka (JP); Masaki Fujikane, Osaka (JP); Akira Inoue, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 132 days.

(21) Appl. No.: 13/398,925

(22) Filed: Feb. 17, 2012

(65) Prior Publication Data

US 2012/0146048 A1    Jun. 14, 2012

Related U.S. Application Data

(63) Continuation of application No. PCT/JP2010/004885, filed on Aug. 3, 2010.

(30) Foreign Application Priority Data

Aug. 24, 2009 (JP) ................................. 2009-193340
Nov. 4, 2009 (JP) ................................. 2009-253479

(51) Int. Cl.
*H01L 29/15*    (2006.01)

(52) U.S. Cl.
USPC .............. 257/76; 257/E33.025; 257/E33.028; 257/E33.033

(58) Field of Classification Search
USPC .............. 257/76, E33.025, E33.028, E33.033
See application file for complete search history.

(56) References Cited

U.S. PATENT DOCUMENTS

| | | | |
|---|---|---|---|
| 5,793,061 | A | 8/1998 | Ohuchi et al. |
| 2004/0012014 | A1* | 1/2004 | Yamanaka et al. .............. 257/13 |
| 2004/0179563 | A1 | 9/2004 | Hasegawa et al. |
| 2007/0122075 | A1 | 5/2007 | Blondeau et al. |
| 2007/0195846 | A1 | 8/2007 | Hasegawa et al. |
| 2008/0118999 | A1* | 5/2008 | Komada .......................... 438/46 |
| 2008/0283851 | A1 | 11/2008 | Akita |
| 2009/0161711 | A1 | 6/2009 | Kubota |

FOREIGN PATENT DOCUMENTS

| | | |
|---|---|---|
| JP | 2001-007447 A | 1/2001 |
| JP | 2002-299762 A | 10/2002 |
| JP | 2007-196342 A | 8/2007 |
| JP | 2007-281387 A | 10/2007 |
| JP | 2008-251641 A | 10/2008 |
| JP | 2008-285364 A | 11/2008 |
| JP | 2009-158955 A | 7/2009 |
| WO | 03/077391 A1 | 9/2003 |
| WO | 2008/153120 A1 | 12/2008 |

OTHER PUBLICATIONS

Notice of Reasons for Rejection for corresponding Japanese Application No. 2011-528627 (which is a Japanese national phase of PCT/JP2010/004885) issued on Mar. 21, 2012 with English translation.

(Continued)

*Primary Examiner* — Timor Karimy
(74) *Attorney, Agent, or Firm* — Renner, Otto, Boisselle & Sklar, LLP

(57) ABSTRACT

Provided is a gallium nitride-based compound semiconductor light-emitting element, in which the concentration of Mg which is a p-type dopant in a p-GaN layer in which the (10-10) m-plane of a hexagonal wurtzite structure grows is adjusted in a range from $1.0 \times 10^{18}$ cm$^{-3}$ to $9.0 \times 10^{18}$ cm$^{-3}$.

8 Claims, 11 Drawing Sheets

(56) References Cited

OTHER PUBLICATIONS

McLaurin et al., "Growth of *p*-type and *n*-type m-plane GaN by Molecular beam epitaxy", Journal of Applied Physics, Sep. 22, 2006, vol. 100, pp. 063707-1 to 063707-7.

International Search Report for corresponding International Application No. PCT/JP2010/004885 mailed Aug. 31, 2010.
International Preliminary Report on Patentability for corresponding International Application No. PCT/JP2010/004885 mailed Aug. 9, 2011.

* cited by examiner

● N
● Ga

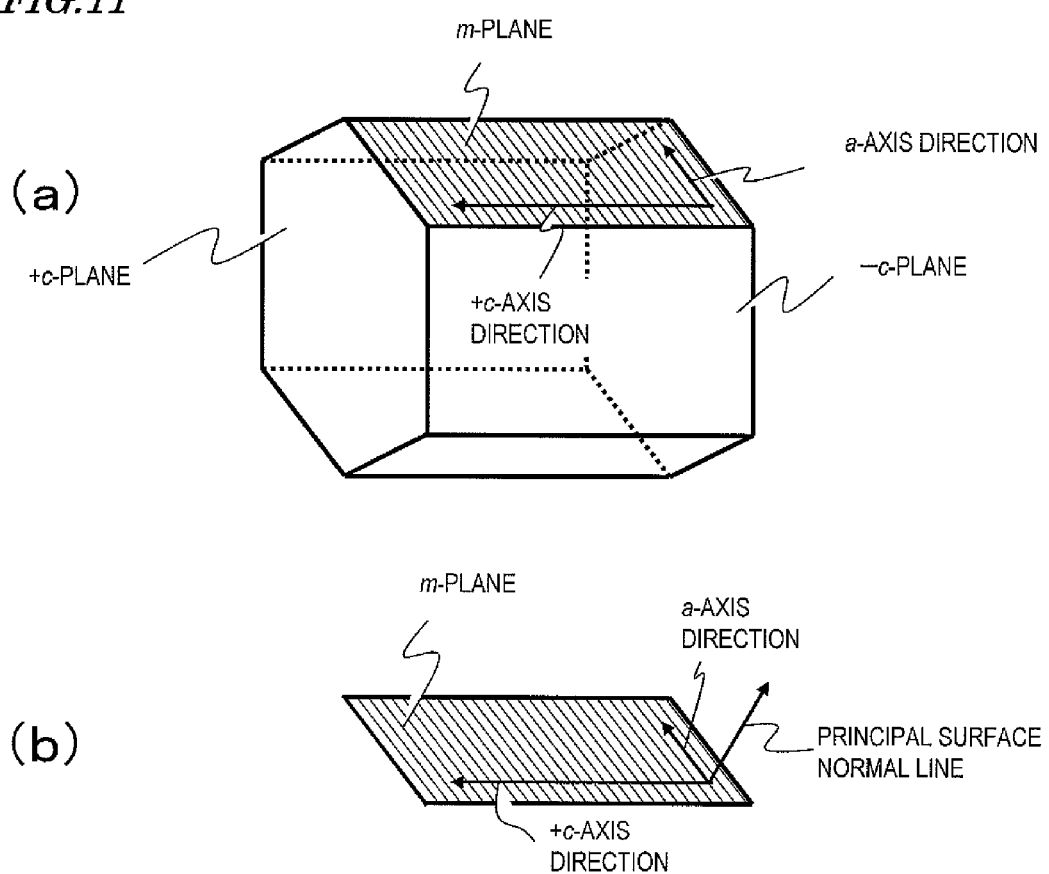

FIG.12
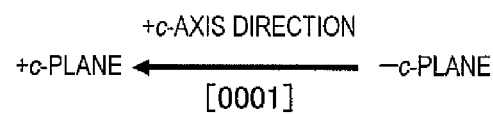
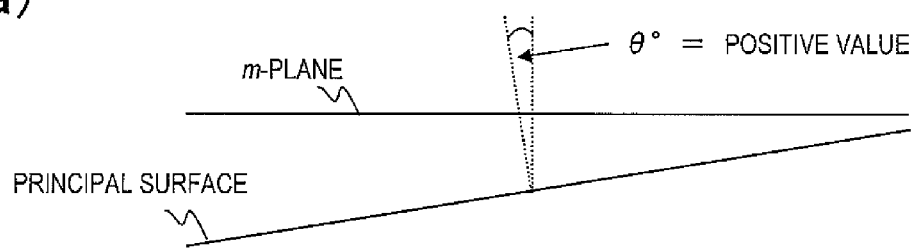
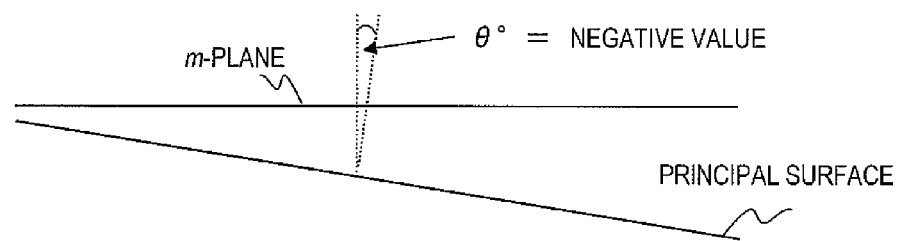

GALLIUM NITRIDE COMPOUND SEMICONDUCTOR LIGHT-EMITTING DEVICE

This is a continuation of International Application No. PCT/JP2010/004885, with an international filing date of Aug. 3, 2010, which claims priority of Japanese Patent Applications No. 2009-193340 filed on Aug. 24, 2009, and No. 2009-253479 filed on Nov. 4, 2009, the contents of which are hereby incorporated by reference.

TECHNICAL FIELD

The present disclosure relates to a gallium nitride-based semiconductor light-emitting element including a p-type gallium nitride-based semiconductor layer doped with Mg.

BACKGROUND ART

Nitride semiconductors containing nitrogen (N) as a Group V element are regarded as promising materials for short-wave light emitting elements because of their band gap sizes. Gallium nitride-based compound semiconductors (GaN-based semiconductors: $Al_xGa_yIn_zN$, $0 \leq x, y, z \leq 1$, $x+y+z=1$), in particular, are being actively studied, and have been put into practical use in the form of blue light-emitting diodes (LEDs), green LEDs, and semiconductor lasers that use the GaN-based semiconductor as a material.

The GaN-based semiconductors each have a wurtzite crystal structure. FIG. 1 schematically illustrates the unit cell of GaN. In crystal of an $Al_xGa_yIn_zN$ ($0 \leq x, y, z \leq 1$, $x+y+z=1$) semiconductor, some of Ga atoms illustrated in FIG. 1 can be substituted for Al and/or In.

FIG. 2 illustrates four fundamental vectors, $a_1$, $a_2$, $a_3$, and c which are commonly used to express planes of a wurtzite crystal structure in four-digit indices (Hexagonal Miller-Bravais indices). The fundamental vector c runs in a [0001] direction, which is called a "c-axis". A plane perpendicular to the c-axis is called a "c-plane" or a "(0001) plane". The "c-axis" and the "c-plane" are sometimes written as "C-axis" and "C-plane", respectively. The capital-letter notation is used in the accompanying drawings for easier viewing.

When manufacturing a semiconductor element by using a GaN-based semiconductor, a c-plane substrate, i.e., a substrate having a (0001) plane as a surface is used as a substrate on which a GaN-based semiconductor crystal is grown. However, electrical polarization is formed on the c-plane where the positions of a Ga atomic layer and a nitrogen atomic layer are slightly misaligned with each other in a c-axis direction. The "c-plane" is therefore also called as a "polar plane". As a result of the electrical polarization, a piezo-electric field is generated along the c-axis direction in a quantum well of InGaN in an active layer. The generation of the piezo-electric field in the active layer shifts the distribution of electrons and holes within the active layer through the quantum-confined Stark effect of carriers, thereby lowering the internal quantum efficiency. This causes an increase in threshold current in the case of a semiconductor laser, and an increase in power consumption and a drop in luminous efficacy in the case of an LED. Furthermore, a rise in injected-carrier density is followed by the screening of the piezo-electric field and a change in emission wavelength.

To solve those problems, using a substrate that has as a surface a non-polar plane, for example, a (10-10) plane which is perpendicular to a [10-10] direction and called an m-plane, is being considered. The sign "–" to the left of a number inside parentheses that indicates a Miller index means a "bar". The m-plane is a plane parallel to the c-axis (the fundamental vector c) and is orthogonal to the c-plane as illustrated in FIG. 2. Electrical polarization does not occur in a direction perpendicular to the m-plane because, on the m-plane, Ga atoms and nitrogen atoms exist on the same atomic plane. Consequently, forming a layered semiconductor structure in a direction perpendicular to the m-plane does not generate a piezoelectric field in the active layer and thus solves the problems described above.

The term m-plane is a collective name for (10-10) planes, (–1010) planes, (1-100) planes, (–1100) planes, (01-10) planes, and (0-110) planes. Herein, "X-plane growth" means epitaxial growth in a direction perpendicular to an X-plane (X=c, m) of a hexagonal wurtzite structure. The X-plane in an X-plane growth may be referred to as "growing plane". A semiconductor layer formed by an X-plane growth may be referred to as "X-plane semiconductor layer".

A gallium nitride-based compound semiconductor light-emitting element is manufactured generally by growing an n-type gallium nitride-based compound semiconductor layer, an active layer, and a p-type gallium nitride-based compound semiconductor layer on a substrate in the stated order. Those gallium nitride-based semiconductor layers are formed by vapor deposition such as metal organic chemical vapor deposition (MOCVD).

Conventionally, a p-type gallium nitride-based semiconductor layer (sometimes referred to simply as "p-type layer" in the following description) is grown by controlling conditions so that magnesium (Mg) which is a p-type dopant is contained at a concentration of $1 \times 10^{19}$ cm$^{-3}$ or higher. Mg atoms contained as dopants in the p-type layer readily bond with hydrogen atoms, and Mg atoms bonded with hydrogen atoms are inert as p-type dopants. Activating heat treatment (annealing) for detaching hydrogen from Mg atoms is sometimes performed for that reason. However, the activating heat treatment activates only a few % of all Mg atoms contained in the p-type layer. In order to obtain a hole concentration of approximately $1 \times 10^{17}$ cm$^{-3}$ which is necessary to exhibit favorable electrical characteristics, the p-type layer therefore needs to be doped with Mg atoms at a concentration 100 times the necessary hole concentration, specifically, $1 \times 10^{19}$ cm$^{-3}$, or more. For favorable electrical characteristics, accomplishing an Mg concentration of approximately 2 to $5 \times 10^{19}$ cm$^{-3}$ is desirable.

Related art concerning p-type doping in a gallium nitride-based compound semiconductor element is disclosed in, for example, Patent Document 1 to Patent Document 3.

CITATION LIST

Patent Literature

Patent Document No. 1: WO 2003-077391 Pamphlet
Patent Document No. 2: Japanese Patent Application Laid-Open Publication No. 2007-281387
Patent Document No. 3: Japanese Patent Application Laid-Open Publication No. 2008-251641

SUMMARY OF INVENTION

Technical Problem

Mg atoms, which are readily diffused in crystal of a gallium nitride-based compound semiconductor, are known to travel even to the active layer during the growth of the p-type layer. Mg atoms diffused to the active layer become non-radiative centers in the active layer, thereby lowering the luminous efficacy of the element markedly. The diffusion to the active layer side from the p-type layer containing Mg atoms at as high a concentration as $1\times10^{19}$ cm$^{-3}$, or more, is significant.

Theoretically, three methods are effective in suppressing the diffusion.

The first is to reduce the concentration of Mg atoms in the p-type layer which is the diffusion source. However, an Mg concentration of $1\times10^{19}$ cm$^{-3}$ or higher is necessary in order for the light-emitting element to exhibit electrical characteristics that are satisfactory as a light-emitting element.

The second is to shorten the growth time of the p-type layer so that the Mg atoms do not have time to diffuse to the active layer. The growth time of the p-type layer is obtained by dividing the objective thickness of the p-type layer by the growth rate. With the growth time shortened, if the growth rate is raised excessively, the crystallinity of the p-type layer deteriorates in most cases and a element that exhibits desired electrical characteristics and light emission characteristics cannot be obtained. If the p-type layer is allowed to be thin in order that the growth time is shortened, the p-type layer cannot fulfill its intended role and the element short-circuits electrically. It is therefore impractical to shorten the growth time for the purpose of suppressing the diffusion of Mg.

The third is to set low the growth temperature of the P-type layer which is the diffusion source in order to keep Mg atoms from easily exceeding an activation potential for diffusion. However, lowering the growth temperature impairs the crystallinity of the p-type layer markedly and therefore is not effective.

Thus, a technology that suppresses the diffusion of Mg atoms enough while securing electrical characteristics satisfactory for a light-emitting element has not been developed.

When the growth temperature of the p-type layer is not lowered excessively, too, the luminous efficacy of the element drops if the Mg concentration is too high. This is because Mg is an impurity for gallium nitride-based compound semiconductors and many impurity levels are formed in the p-type layer which contains Mg atoms at a high concentration. When the p-type layer has many impurity levels, the proportion of light that cannot be transmitted through the p-type layer and is absorbed is high with respect to light emitted by the active layer. Setting the Mg concentration of the p-type layer to $1\times10^{19}$ cm$^{-3}$ or higher in order to secure a resistance satisfactorily low for a light-emitting element leads to a problem of facilitating the absorption of light in the p-type layer.

Patent Document 1 teaches to insert an undoped diffusion suppressing layer between the active layer and the p-type layer in order to suppress the diffusion of Mg atoms. This diffusion suppressing layer does not completely block the diffusion of Mg atoms and, being an undoped layer, raises the electric resistance of the element. Patent Document 1 also discloses an embodiment in which an n-type diffusion suppressing layer doped with silicon (Si) is provided. However, giving a diffusion suppressing layer the n-type conductivity has an adverse effect in that the efficiency in injecting holes from the p-type layer to the active layer drops.

Patent Document 2 discloses that a hole concentration necessary for a light-emitting element is accomplished by using beryllium (Be), which is higher in activation rate than Mg, as a p-type dopant at a dopant concentration lower than when Mg is used. In the case where the p-type layer is doped with Be atoms, the necessary dopant concentration is low and accordingly fewer Be atoms are diffused to the active layer, with the result that the luminous efficacy of the element is high. However, Be is a substance harmful to the human body and using Be is undesirable. In addition, although the necessary dopant concentration of Be is low, the p-type layer still needs a dopant concentration of $1\times10^{19}$ cm$^{-3}$ or higher in order to have a satisfactorily low resistance. Doping the p-type layer with Be atoms thus does not give the p-type layer favorable crystallinity, too, and, consequently, the p-type layer is not prevented from absorbing light that has been emitted by the active layer.

Patent Document 3 discloses the forming of the p-type layer that involves alternately forming by deposition two nitride gallium-based compound semiconductor layers which have different compositions. In this p-type layer, only one of the two gallium nitride-based compound semiconductor layers having different compositions is doped with Mg and the Mg concentration rises as the distance from the active layer increases. When a structure as this is employed, the diffusion of Mg atoms is suppressed but the efficiency in injecting holes to the active layer drops significantly because the Mg concentration is low in a region of the p-type layer that is near the active layer.

A main object of the present disclosure is to provide a gallium nitride-based compound semiconductor light-emitting element including a p-type gallium nitride-based compound semiconductor layer that contains Mg enhanced in activation rate, and a method of manufacturing the light-emitting element.

Solution to Problem

According to an embodiment of the present invention, there is provided a gallium nitride-based compound semiconductor light-emitting element, including: an n-type gallium nitride-based compound semiconductor layer; a p-type gallium nitride-based compound semiconductor layer; an active layer, which is located between the n-type gallium nitride-based compound semiconductor layer and the p-type gallium nitride-based compound semiconductor layer; a p-type overflow suppressing layer, which is located between the p-type gallium nitride-based compound semiconductor layer and the active layer; and a p-type electrode, which is in contact with the p-type gallium nitride-based compound semiconductor layer, in which the p-type gallium nitride-based compound semiconductor layer includes an m-plane semiconductor layer, and the active layer side of the p-type gallium nitride-based compound semiconductor layer includes a region that is doped with Mg at a concentration of $1.0\times10^{18}$ cm$^{-3}$ or more and $9.0\times10^{18}$ cm$^{-3}$ or less.

In an embodiment, the p-type overflow suppressing layer is doped with Mg at a concentration of $1.0\times10^{18}$ cm$^{-3}$ or more and $9.0\times10^{18}$ cm$^{-3}$ or less.

In another embodiment, a portion of the p-type gallium nitride-based compound semiconductor layer that is at a distance of 45 nm or less from the active layer has an Mg concentration of $1.0\times10^{18}$ cm$^{-3}$ or more and $9.0\times10^{18}$ cm$^{-3}$ or less.

In still another embodiment, the gallium nitride-based compound semiconductor light-emitting element further includes an undoped spacer layer, which is interposed between the active layer and the p-type overflow layer.

In still another embodiment, the active layer and the p-type overflow layer are in contact with each other.

In still another embodiment, the p-type gallium nitride-based compound semiconductor layer is a GaN layer.

In still another embodiment, the p-type electrode side of the p-type gallium nitride-based compound semiconductor layer includes a region that is doped with Mg at a concentration higher than $9.0\times10^{18}$ cm$^{-3}$.

According to an embodiment of the present invention, there is also provided a gallium nitride-based compound semiconductor light-emitting element, including: an n-type gallium nitride-based compound semiconductor layer; a p-type gallium nitride-based compound semiconductor layer; an active layer, which is located between the n-type gallium nitride-based compound semiconductor layer and the p-type gallium nitride-based compound semiconductor layer; and a p-type electrode, which is in contact with the p-type gallium nitride-based compound semiconductor layer, in which the p-type gallium nitride-based compound semiconductor layer is an m-plane semiconductor layer, and the active layer side of the p-type gallium nitride-based compound semiconductor layer includes a region that is doped with Mg at a concentration of $1.0\times10^{18}$ cm$^{-3}$ or more and $9.0\times10^{18}$ cm$^{-3}$ or less.

In an embodiment, a portion of the p-type gallium nitride-based compound semiconductor layer that is at a distance of 45 nm or less from the active layer has an Mg concentration of $2.0\times10^{18}$ cm$^{-3}$ or more and $8.0\times10^{18}$ cm$^{-3}$ or less.

In another embodiment, the gallium nitride-based compound semiconductor light-emitting element further includes an undoped spacer layer, which is interposed between the active layer and the p-type gallium nitride-based compound semiconductor layer.

In still another embodiment, the active layer and the p-type gallium nitride-based compound semiconductor layer are in contact with each other.

In still another embodiment, the p-type gallium nitride-based compound semiconductor layer is a GaN layer.

In still another embodiment, the p-type electrode side of the p-type gallium nitride-based compound semiconductor layer includes a region that is doped with Mg at a concentration higher than $9.0\times10^{18}$ cm$^{-3}$.

In an embodiment, there is provided a method of manufacturing a gallium nitride-based compound semiconductor light-emitting element, including: a step (A) of forming an n-type gallium nitride-based compound semiconductor layer; a step (B) of forming an active layer on the n-type gallium nitride-based compound semiconductor layer; a step (C) of forming a p-type gallium nitride-based compound semiconductor layer on the active layer; and a step (D) of forming a p-type electrode, which is in contact with the p-type gallium nitride-based compound semiconductor layer, in which the step (C) includes growing the p-type gallium nitride-based compound semiconductor layer by m-plane growth and doping the active layer side of the p-type gallium nitride-based compound semiconductor layer with Mg at a concentration of $1.0\times10^{18}$ cm$^{-3}$ or more and $9.0\times10^{18}$ cm$^{-3}$ or less.

According to an embodiment of the present invention, there is still also provided a gallium nitride-based compound semiconductor light-emitting element, including: an n-type gallium nitride-based compound semiconductor layer; a p-type gallium nitride-based compound semiconductor layer; an active layer, which is located between the n-type gallium nitride-based compound semiconductor layer and the p-type gallium nitride-based compound semiconductor layer; a p-type overflow suppressing layer, which is located between the p-type gallium nitride-based compound semiconductor layer and the active layer; and a p-type electrode, which is in contact with the p-type gallium nitride-based compound semiconductor layer, in which the p-type gallium nitride-based compound semiconductor layer is a semiconductor layer that is inclined at an angle of 1° or more from an m-plane, and an angle formed between a normal line of a principal surface of the p-type gallium nitride-based compound semiconductor layer and a normal line of the m-plane is 1° or more and 5° or less, and the active layer side of the p-type gallium nitride-based compound semiconductor layer includes a region that is doped with Mg at a concentration of $1.0\times10^{18}$ cm$^{-3}$ or more and $9.0\times10^{18}$ cm$^{-3}$ or less.

In an embodiment, the p-type gallium nitride-based compound semiconductor layer is a semiconductor layer inclined in a c-axis direction or an a-axis direction.

According to an embodiment of the present invention, there is still also provided a gallium nitride-based compound semiconductor light-emitting element, including: an n-type gallium nitride-based compound semiconductor layer; a p-type gallium nitride-based compound semiconductor layer; an active layer, which is located between the n-type gallium nitride-based compound semiconductor layer and the p-type gallium nitride-based compound semiconductor layer; and a p-type electrode, which is in contact with the p-type gallium nitride-based compound semiconductor layer, in which the p-type gallium nitride-based compound semiconductor layer is a semiconductor layer that is inclined at an angle of 1° or more from an m-plane, and an angle formed between a normal line of a principal surface of the p-type gallium nitride-based compound, semiconductor layer and a normal line of the m-plane is 1° or more and 5° or less, and the active layer side of the p-type gallium nitride-based compound semiconductor layer includes a region that is doped with Mg at a concentration of $1.0\times10^{18}$ cm$^{-3}$ or more and $9.0\times10^{18}$ cm$^{-3}$ or less.

Advantageous Effects of Invention

In a gallium nitride-based compound semiconductor light-emitting element according to the present disclosure, the diffusion of Mg from the p-type layer to the active layer is suppressed and the generation of non-radiative centers is therefore prevented in the active layer. The p-type layer can also be formed by deposition directly on the active layer in a manner that brings the p-type layer into contact with the active layer, and this eliminates the need to insert an undoped diffusion suppressing layer, which is a cause for high resistance, between the active layer and the p-type layer. High luminous efficacy is thus accomplished without raising the operating voltage. Moreover, high-concentration Mg doping can be avoided, which allows the p-type layer to maintain favorable crystallinity. The proportion of light that is absorbed in the p-type layer with respect to light emitted by the active layer is therefore reduced greatly.

In addition, the active layer is formed by m-plane growth and, accordingly, the quantum-confined Stark effect which has been a problem in conventional c-plane growth is not caused.

BRIEF DESCRIPTION OF DRAWINGS

FIG. 11(a) is a diagram schematically illustrating the crystal structure (wurtzite crystal structure) of a GaN-based compound semiconductor and FIG. 11(b) is a perspective view illustrating a relation between the normal line of an m-plane, a +c-axis direction, and an a-axis direction.

FIGS. 12(a) and 12(b) are each a sectional view illustrating the arrangement relation between a principal surface of a GaN-based compound semiconductor layer and an m-plane.

DESCRIPTION OF EMBODIMENTS

The inventors of the present invention have found out that the diffusion of Mg atoms can be prevented in the first place while maintaining a satisfactorily low resistivity by manufacturing a p-type gallium nitride-based compound semiconductor having an appropriate Mg concentration so that an m-plane of a hexagonal wurtzite structure serves as a growing plane, and thus have completed the present subject matter.

Conventionally, a light-emitting element that uses a gallium nitride-based compound semiconductor is manufactured with a (0001) plane, i.e., a c-plane, as a growing plane. The prior art that is disclosed in Patent Documents described above, too, relate to gallium nitride-based compound semiconductor light-emitting elements manufactured by c-plane growth.

The inventors of the present invention have found out that the activation rate of Mg, which is a p-type dopant, in a p-type gallium nitride-based compound semiconductor that is manufactured by m-plane growth is several times higher than in a p-type gallium nitride-based compound semiconductor that is manufactured by c-plane growth. This finding is described below.

Figure 3A:
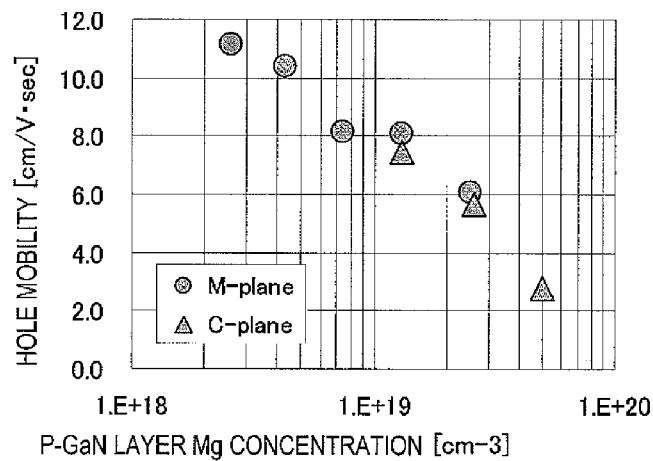
FIG. 3A is a graph showing a relation between the Mg concentration in a p-GaN layer and the hole mobility.

FIG. 3A is a graph showing a relation between the Mg concentration of a p-type GaN layer and the hole mobility.

Figure 3B:
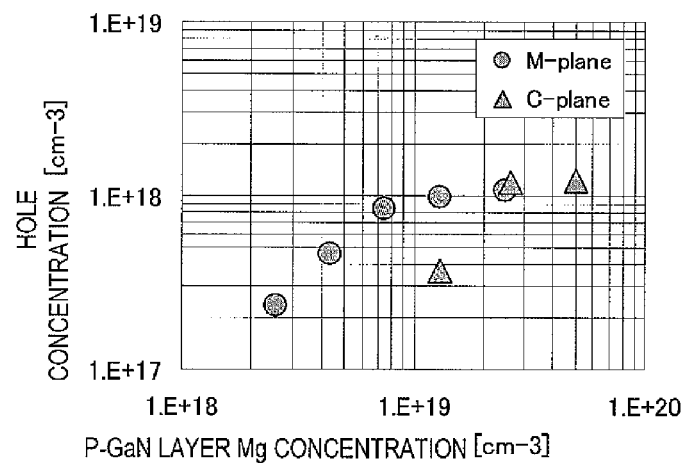
FIG. 3B is a graph showing a relation between the Mg concentration in a p-GaN layer and the hole concentration.
Figure 4:
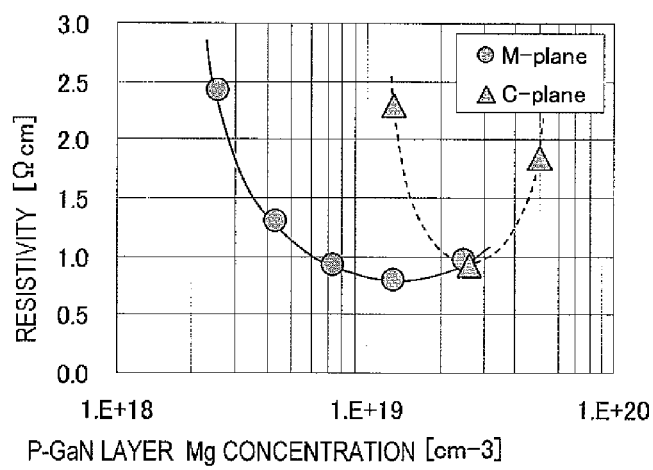
FIG. 4 is a graph showing a relation between the Mg concentration in a p-GaN layer and the resistivity.

FIG. 3B is a graph showing a relation between the Mg concentration of a p-type GaN layer and the hole concentration. FIG. 4 is a graph showing a relation between the Mg concentration of a p-type GaN layer and the resistivity. In each of these graphs, the axis of abscissa represents the Mg concentration of a p-type GaN layer and is expressed on a logarithmic scale: for example, "1.E+19" means "$1 \times 10^{19}$". This concentration notation applies to graphs of the other drawings as well.

In each graph of FIGS. 3A, 3B, and 4, a white circle represents a result about a p-type GaN layer manufactured by m-plane growth and a white triangle represents a result about a p-type GaN layer manufactured by c-plane growth for comparison. The graphs of FIGS. 3A, 3B, and 4 are based on results that have been obtained by performing a Hall effect measurement on a plurality of samples prepared by the following method. Each sample has been prepared by forming by deposition an undoped GaN layer to a thickness of 1 μm and a p-type layer doped with Mg to a thickness of 0.75 μm in the stated order on an m-plane or c-plane GaN substrate, which serves as a base, and then performing annealing (830° C., 20 minutes) in a nitrogen atmosphere. The prepared samples include five different m-plane growth samples whose Mg concentrations are respectively $2.6 \times 10^{18}$ cm$^{-3}$, $4.3 \times 10^{18}$ cm$^{-3}$, $7.4 \times 10^{18}$ cm$^{-3}$, $1.3 \times 10^{19}$ cm$^{-3}$, and $2.5 \times 10^{19}$ cm$^{-3}$, and three different c-plane growth samples whose Mg concentrations are respectively $1.3 \times 10^{19}$ cm$^{-3}$, $2.6 \times 10^{19}$ cm$^{-3}$, and $5.0 \times 10^{19}$ cm$^{-3}$. The Mg concentration has been measured by secondary ion mass spectrometry (SIMS).

As shown in FIG. 3A, the hole mobility decreases as the Mg concentration increases in a pattern common to m-plane growth and c-plane growth both. The hole concentration, on the other hand, differs between m-plane growth and c-plane growth in terms of pattern prior to saturation as shown in FIG. 3B, although the hole concentration reaches saturation at approximately $1 \times 10^{18}$ cm$^{-3}$ in both cases. In a comparison between an m-plane growth p-type layer and a c-plane growth p-type layer that contain Mg atoms at the same concentration, $1.3 \times 10^{19}$ cm$^{-3}$, before the hole concentration reaches saturation, the hole concentration is larger in the m-plane growth p-type layer than in the c-plane growth p-type layer despite the same annealing conditions. It can therefore be said that the activation rate is higher in an m-plane growth p-type layer than in a c-plane growth p-type layer.

When the Mg concentration is $1.3 \times 10^{19}$ cm$^{-3}$, the activation rate in an m-plane growth p-type layer is 3 to 4 times higher than in a c-plane growth p-type layer. Accordingly, as shown in FIG. 4, an Mg concentration at which the resistivity is lowest for m-plane growth p-type layers is lower than an Mg concentration at which the resistivity is lowest for c-plane growth p-type layers. In m-plane growth p-type layers, the resistivity also stays within a satisfactorily low range even when the Mg concentration is relatively low. The ease of detaching hydrogen atoms is one of possible factors that make the activation rate of Mg higher in an m-plane growth p-type layer than in a c-plane growth p-type layer, but the exact details are unclear.

As can be seen in FIG. 4, c-plane growth p-type layers have a narrow Mg concentration range in which the resistivity takes a local minimum value, and the resistivity exceeds 2.5 Ωcm as soon as the Mg concentration becomes lower than $1.0 \times 10^{19}$ cm$^{-3}$. This pattern in c-plane growth p-type layers matches well with results illustrated in FIG. 8 of Patent Document 2. In m-plane growth p-type layers, on the other hand, the resistivity stays around 2.5 Ωcm even when the Mg concentration is as low as $2.0 \times 10^{18}$ cm$^{-3}$. A satisfactorily low resistivity can therefore be achieved with an m-plane growth p-type layer while keeping the Mg concentration at a low level that does not cause diffusion.

FIGS. 5(a) and 5(b) are each a graph showing results of an SIMS measurement of an LED structure that is manufactured by m-plane growth. In FIGS. 5(a) and 5(b), a bold line, a very thin line, a solid line, and a dotted line represent the depth-direction concentration profiles of Mg, Ga, Al, and In, respectively. The concentrations of Ga, Al, and In are expressed in intensity (counts/sec) which is represented by the axis of ordinate on the right-hand side of the drawings and the concentration of Mg is expressed in concentration (atoms/cm$^3$) which is represented by the axis of ordinate on the left-hand side of the drawings. In each sample used for the SIMS measurement, an n-GaN layer, a multiple quantum layer which is constituted of an InGaN well layer and a GaN barrier layer, and a p-GaN layer are formed by deposition on a base substrate in the stated order. The axis of abscissa of each graph represents the depth from a sample surface. A region where the intensity of Al atoms is $1.5 \times 10^5$ counts/sec or higher corresponds to a p-AlGaN layer described later, and the p-AlGaN layer is in contact with the InGaN well layer of the active layer. In FIGS. 5(a) and 5(b), a depth point where a curve representing the Al concentration profile and a curve representing the In concentration profile intersect each other corresponds to the start point (bottom face) of the formation of the p-type layer.

The sample of FIG. 5(a) is an LED sample prepared by controlling conditions so that the Mg concentration of the p-GaN layer is $1.5 \times 10^{19}$ cm$^{-3}$. The sample of FIG. 5(b), on the other hand, is an LED sample prepared by controlling conditions so that the p-GaN layer has an Mg concentration of $6.5 \times 10^{18}$ cm$^{-3}$. The p-GaN layer growth conditions common to both samples include setting the temperature to 1000° C. and setting the growth time to 70 minutes.

As a marker that indicates a doping start point (depth point) of Mg, a p-AlGaN layer having a thickness of 20 nm is formed by deposition at the beginning of the p-GaN layer. Biscyclopentadienyl magnesium (Cp$_2$Mg) has been started to be supplied as a raw material of Mg at the same time the forming of the AlGaN layer by deposition is started. Therefore, an Al peak point can be associated with the Mg doping start point in the SIMS analysis results. Mg that is present in a region deeper than this Al peak point (namely, Mg in the active layer) can be deemed as Mg that has traveled by diffusion from the p-type layer (the p-GaN layer or the p-AlGaN layer). There is no sense in distinguishing the p-AlGaN layer from the p-GaN layer in the diffusion of Mg atoms, and the description given here may include the p-AlGaN layer in the term "p-GaN layer".

The Mg profile of FIG. 5(a) shows that the diffusion of Mg atoms from the Al peak point to the active layer side occurs even in the case of m-plane growth. Specifically, Mg atoms are distributed at as high a concentration as $1 \times 10^{19}$ cm$^{-3}$ in substantially the entire area of the active layer. The distance between the p-AlGaN layer and a point on the active layer side to which Mg atoms have traveled farthest from the p-GaN layer (strictly, the p-AlGaN layer) (an arrival point) is referred to as "penetration length". The arrival point of Mg atoms is defined as a depth at which the Mg concentration drops to half of the average Mg concentration of the p-GaN layer. The "penetration length" of Mg atoms is approximately 60 nm in the sample of FIG. 5(a).

In the LED sample that has been prepared under the same conditions except that the conditions have been controlled to give the p-GaN layer an Mg concentration of $6.5 \times 10^{18}$ cm$^{-3}$ in m-plane growth, the Mg profile rapidly drops in a manner that follows the Al profile and substantially no Mg atoms have diffused to the active layer side as shown in FIG. 5(b). The penetration length measured based on the Mg profile of FIG. 5(b) is approximately less than 10 mm. It can therefore be determined that the diffusion of Mg atoms has scarcely occurred in the LED sample of FIG. 5(b).

The number of Mg atoms that have entered the active layer through diffusion per 1 cm$^{-3}$ (diffused Mg density) can be estimated based on the Mg profile. The diffused Mg density in the sample of FIG. 5(b) is one-tenth of the diffused Mg density in the sample of FIG. 5(a) or less. Mg is thus hardly diffused when the Mg concentration in the p-GaN layer is $6.5 \times 10^{18}$ cm$^{-3}$.

Figure 6:
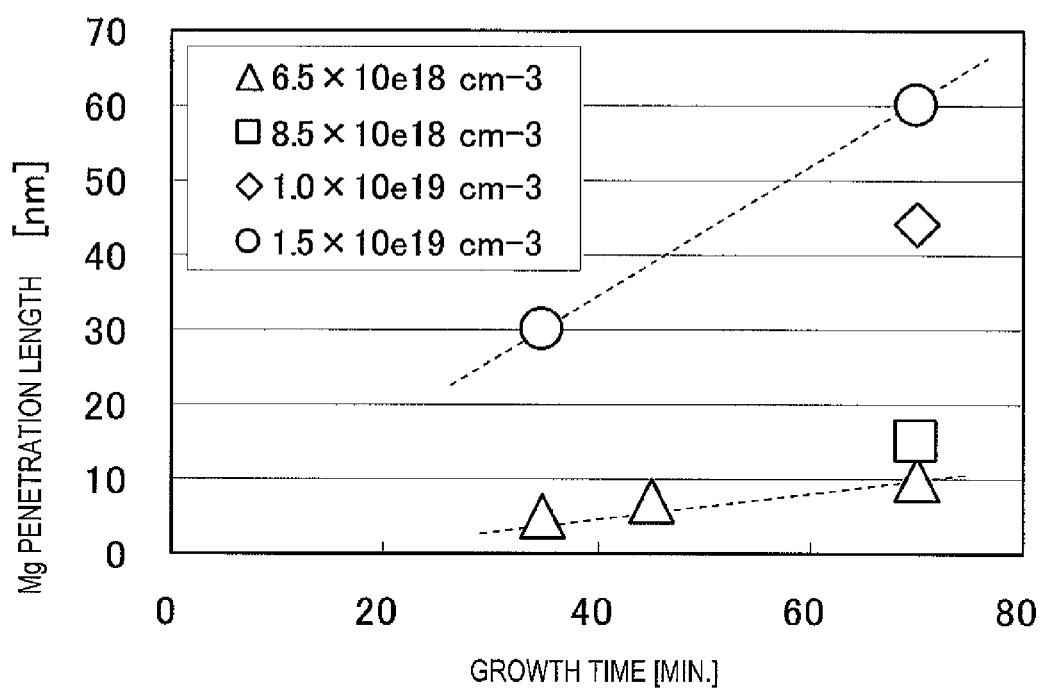
FIG. 6 is a graph showing a relation between the growth time of a p-GaN layer and the penetration length of the diffusion of Mg atoms.

FIG. 6 shows a relation between the growth time of a p-type layer manufactured by m-plane growth (growth temperature: 1000° C.) and the penetration length of Mg atoms through diffusion. In the graph of FIG. 6, a white circle, a white diamond, a white square, and a white triangle respectively represent data obtained when the Mg concentration is $1.5 \times 10^{19}$ cm$^{-3}$, data obtained when the Mg concentration is $1.0 \times 10^{19}$ cm$^{-3}$, data obtained when the Mg concentration is $8.5 \times 10^{19}$ cm$^{-3}$, and data obtained when the Mg concentration is $6.5 \times 10^{18}$ cm$^{-3}$.

The diffusion penetration length and the growth time have a substantially linear relation when the Mg concentration is $1.5 \times 10^{19}$ cm$^{-3}$ and when the Mg concentration is $6.5 \times 10^{18}$ cm$^{-3}$ both. It is inferred from this fact that the growth time needs to be shorter than 10 minutes in order to keep the penetration length less than 10 nm when the Mg concentration is $1.5 \times 10^{19}$ cm$^{-3}$. In this case, the growth rate of the p-type layer needs to be raised greatly to obtain a necessary thickness. It is uncertain whether or not the Mg doping characteristics can be maintained under the high-growth rate condition. Raising the growth rate greatly also impairs the crystallinity of the p-type layer.

In a comparison among p-type layers that have a growth time of 70 minutes, the penetration length decreases as the Mg concentration drops and, when the Mg concentration is lower than $1.0 \times 10''$ cm$^{-3}$ in particular, the decrement of the penetration length is large. When the Mg concentration is lower than $1.0 \times 10^{19}$ cm$^{-3}$, the penetration length hardly increases even if the growth time exceeds an hour, and a p-type layer having a necessary thickness can be formed by deposition without raising the growth rate excessively.

Figure 7A:
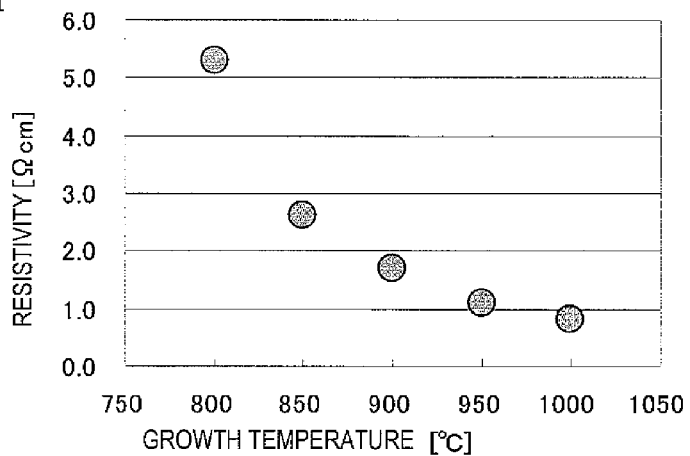
FIG. 7A is a graph showing a relation between the growth temperature of a p-GaN layer and the resistivity.
Figure 7B:
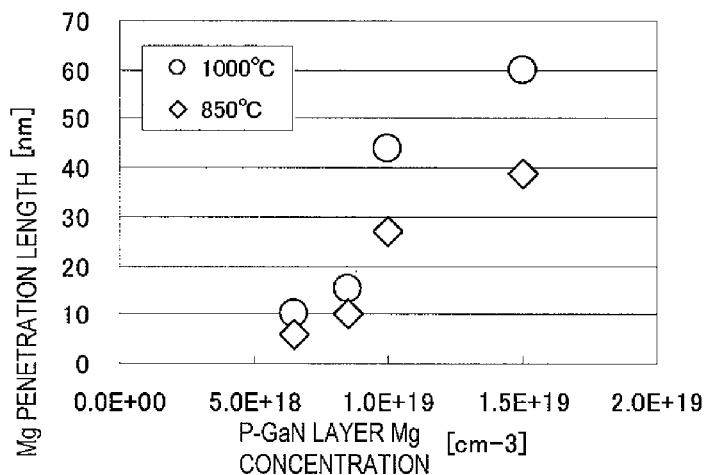
FIG. 7B is a graph showing a relation between the Mg concentration and the penetration length of diffusion that is observed when the growth temperature of a p-GaN layer is 1000° C. and 850° C.

If the growth temperature of the p-type layer can be set low, the diffusion of Mg atoms is suppressed to a certain degree. FIG. 7A is a graph showing a relation between the growth temperature of a p-type layer and the resistivity of the p-type layer. FIG. 7B is a graph showing a relation between the Mg concentration of a p-type layer and the Mg atom penetration length. The resistivity measured in FIG. 7A is of samples that have the same structure as that of the samples of FIGS. 3A, 3B, and 4. The Mg concentration of the p-type layer in these samples is $1.0 \times 10^{19}$ cm$^{-3}$ to $1.5 \times 10^{19}$ cm$^{-3}$. The Mg atom penetration length of FIG. 7B is obtained from SIMS analysis results of samples prepared by forming a p-type layer by 70 minutes of deposition.

The resistivity of a p-type layer tends to increase when the growth temperature is lowered. The resistivity at a growth temperature of 800° C. has been higher than 5.0 Ωcm. It is preferred from the viewpoint of electrical characteristics to set the growth temperature of the p-type layer to 850° C. or higher.

The penetration length of Mg atoms is shorter when the growth temperature of the p-type layer is 850° C. than when the growth temperature is 1000° C. as shown in FIG. 7B. However, this difference in penetration length is insignificant when the Mg concentration is lower than $1.0 \times 10^{19}$ cm$^{-3}$.

Lowering the growth temperature is not much effective in suppressing the diffusion of Mg atoms when the Mg concentration is lower than $1.0\times10^{19}$ cm$^{-3}$.

It is understood from the results of FIGS. 6 and 7B that lowering the Mg concentration is most effective in suppressing the diffusion of Mg atoms.

Figure 8:
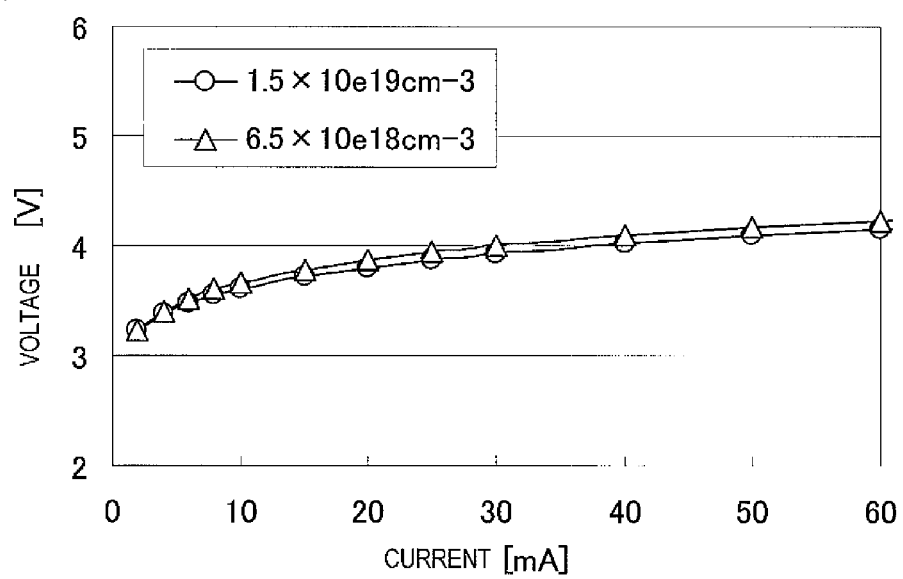
FIG. 8 is a graph showing the current-voltage characteristics of LED samples whose p-GaN layers have different Mg concentrations.

FIG. 8 is a graph showing the current-voltage characteristics of LEDs manufactured by m-plane growth. The graph shows current-voltage characteristics observed when the Mg concentration of the p-type layer is $6.5\times10^{18}$ cm$^{-3}$ and current-voltage characteristics observed when the Mg concentration of the p-type layer is $1.5\times10^{19}$ cm$^{-3}$.

The resistivity of the p-type layer is higher when the Mg concentration is $6.5\times10^{18}$ cm$^{-3}$ than when the Mg concentration is $1.5\times10^{19}$ cm$^{-3}$ according to FIG. 4. However, as can be seen in FIG. 8, the difference in Mg concentration does not cause a significant difference in current-voltage characteristics, and a voltage satisfactorily low for a light-emitting element is accomplished despite low Mg concentration.

The present subject matter utilizes the fact that the electrical characteristics of a gallium nitride-based compound semiconductor light-emitting element that is manufactured by m-plane growth are not impaired by lowering the Mg concentration in the p-type layer to substantially half the Mg concentration of a conventional c-plane growth p-type layer. In a p-type layer controlled to have an Mg concentration within an appropriate range, the diffusion of Mg to the active layer can be prevented in the first place. This keeps non-radiative centers in the active layer from increasing and simultaneously reduces light absorption that occurs in the p-type layer, thereby avoiding the deterioration of the luminous efficacy of the element.

Figure 9A:
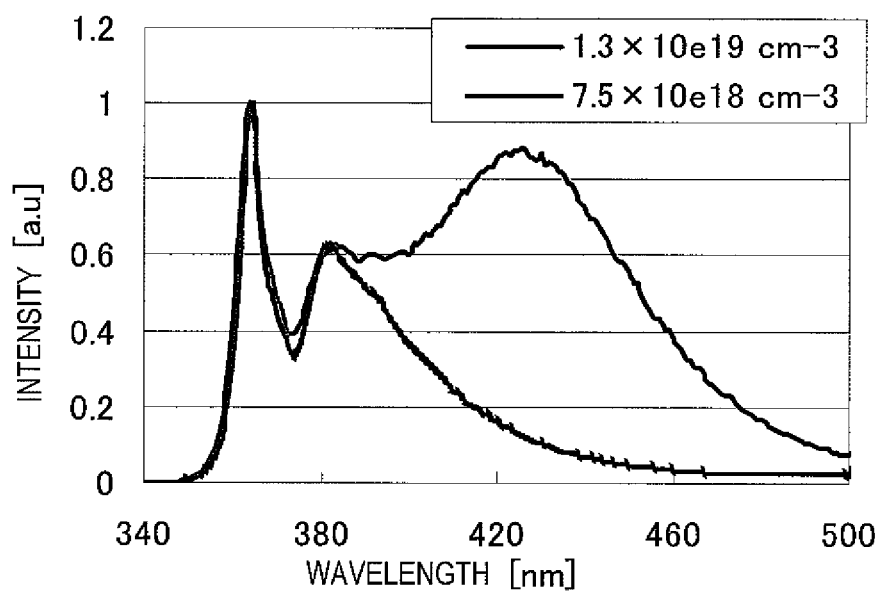
FIG. 9A is a graph showing two different emission spectra that are observed when the Mg concentration of a p-GaN layer is varied.
Figure 9B:
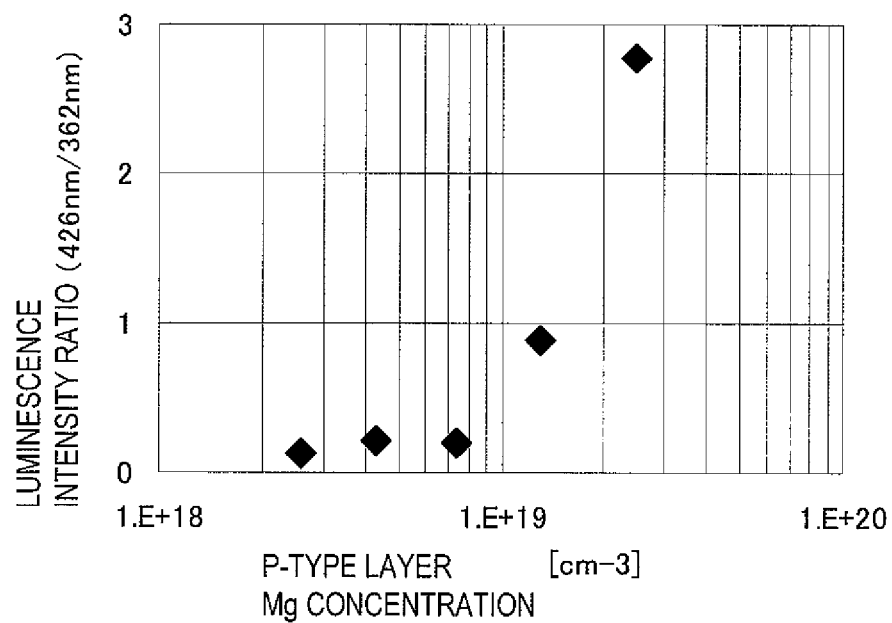
FIG. 9B is a graph showing the dependence of the luminescence intensity ratio on the Mg concentration of a p-GaN layer.

A relation between light absorption by the p-type layer and the Mg concentration of the p-type layer is described below with reference to FIGS. 9A and 9B. FIG. 9A is a graph showing two different photoluminescence (PL) spectra that are observed when the Mg concentration of a p-GaN layer is varied. FIG. 9B is a graph showing the dependence of the ratio of a luminescence intensity at a wavelength of 426 nm to a luminescence intensity at a wavelength of 362 nm (luminescence intensity ratio) on the Mg concentration of a p-GaN layer.

In the spectra of FIG. 9A, a band edge emission peak is observed near a wavelength of 362 nm and a donor-acceptor pair peak is observed near a wavelength of 390 nm regardless of whether the Mg concentration is high or low. When the Mg concentration is $7.5\times10^{18}$ cm$^{-3}$, the luminescence intensity decreases constantly as the wavelength increases in a range where the wavelength is approximately 380 nm or higher, whereas the luminescence intensity noticeably peaks at a wavelength of approximately 426 nm when the Mg concentration is $1.3\times10^{19}$ cm$^{-3}$. This means that another level is generated in energy near a wavelength of 426 nm. This level is an impurity level generated by Mg present in an excessive amount in the p-GaN layer. There is a fear that light emitted from the active layer and having a wavelength around or longer than 426 nm may be absorbed by the p-GaN layer.

As can be seen in FIG. 9B, the peak intensity of an impurity level relatively increases when the Mg concentration exceeds $1\times10^{19}$ cm$^{-3}$. This means that the density of states of the impurity level is higher and, consequently, more spots in the p-GaN layer absorb light whose wavelength is within the visible light range. When the light absorption occurs, the amount of light taken out of the element decreases and the effective luminous efficacy drops, which is undesirable. According to the present disclosure, where the Mg concentration is set to a range from $1.0\times10^{19}$ cm$^{-3}$ to $9.0\times10^{18}$ cm$^{-3}$, the light absorption described above hardly occurs and a high luminous efficacy is realized.

First Embodiment

A gallium nitride-based compound semiconductor light-emitting element according to a first embodiment of the present invention is described with reference to FIGS. 10A and 10B.

Figure 10A:
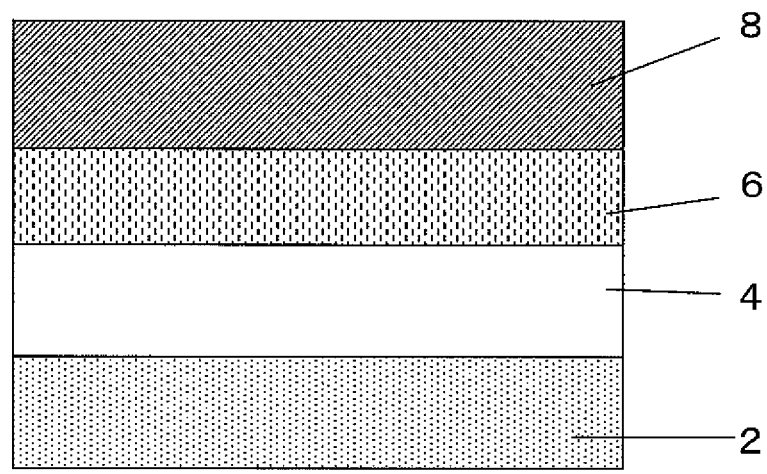
FIG. 10A is a sectional view illustrating a gallium nitride-based compound semiconductor light-emitting element according to a first embodiment of the present invention.

The light-emitting element of this embodiment includes, as illustrated in FIG. 10A, an n-type GaN-based compound semiconductor layer 2, a p-type GaN-based compound semiconductor layer 8, an active layer 4, which is located between the n-type GaN-based compound semiconductor layer 2 and the p-type GaN-based compound semiconductor layer 8, and a p-type overflow suppressing layer 6, which is located between the p-type GaN-based compound semiconductor layer 8 and the active layer 4. The p-type GaN-based compound semiconductor layer 2 and the p-type overflow suppressing layer 6 are m-plane semiconductor layers and doped with Mg at a concentration of $1.0\times10^{18}$ cm$^{-3}$ to $9.0\times10^{18}$ cm$^{-3}$.

In this embodiment, where the Mg concentration in the m-plane p-type layer is within a range of $1.0\times10^{18}$ cm$^{-3}$ to $9.0\times10^{18}$ cm$^{-3}$, a satisfactorily high hole concentration is accomplished and necessary current-voltage characteristics are realized while the lowering of luminous efficacy due to the diffusion of Mg is avoided as described above. The need to dope the active layer with Si for the purpose of suppressing the diffusion of Mg is also eliminated.

The p-type GaN-based compound semiconductor layer 8 is typically formed from GaN and preferably has a thickness adjusted to 50 nm or more and 800 nm or less. The p-type overflow suppressing layer 6, on the other hand, is formed from AlGaN and preferably has a thickness adjusted to 10 nm or more and 50 nm or less.

Figure 10B:
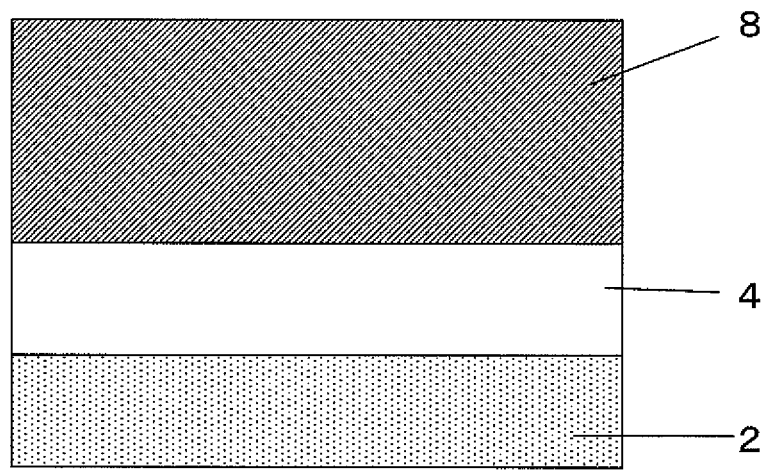
FIG. 10B is a sectional view illustrating a modification example of the gallium nitride-based compound semiconductor light-emitting element according to the first embodiment of the present invention.

The p-type overflow suppressing layer 6 is not a component indispensable to the present subject matter and may be omitted as illustrated in FIG. 10B. In the example of FIG. 10B, the p-type GaN-based compound semiconductor layer 2 is doped with Mg at a concentration of $1.0\times10^{18}$ cm$^{-3}$ to $9.0\times10^{18}$ cm$^{-3}$.

In the case where the p-type GaN-based compound semiconductor layer 8 is thick (for example, as thick as 500 nm or more), the Mg concentration in the p-type GaN-based compound semiconductor layer 8 does not need to be adjusted to $1.0\times10^{18}$ cm$^{-3}$ to $9.0\times10^{18}$ cm$^{-3}$ throughout the entire p-type GaN-based compound semiconductor layer 8. The reason the Mg concentration is set low is, as described above, to suppress the diffusion of Mg to the active layer. Therefore, when the p-type GaN-based compound semiconductor layer 8 is thick relative to the penetration length of Mg atoms, the Mg concentration does not need to be set low in a region of the p-type GaN-based compound semiconductor layer 8 that is at a greater distance from the active layer than the penetration length. As illustrated in FIG. 6, the penetration length of Mg atoms is about 45 nm when the Mg concentration is $1.0\times10^{19}$ cm$^{-3}$ and the growth time of the p-type layer is 70 minutes. Accordingly, while a region of the p-type GaN-based compound semiconductor layer 8 that is at a distance of 45 nm or less from the active layer 4 should be controlled to have an Mg concentration of $1.0\times10^{18}$ cm$^{-3}$ to $9.0\times10^{18}$ cm$^{-3}$, desirably $2.0\times10^{18}$ cm$^{-3}$ to $8.0\times10^{18}$ cm$^{-3}$, more desirably $3.0\times10^{18}$ cm$^{-3}$ to $7.0\times10^{18}$ cm$^{-3}$, a region of the p-type GaN-based compound semiconductor layer 8 that is at a distance of more than 45 nm from the active layer 4 may be doped with Mg at a concentration higher than $9.0 \times 10^{18}$ cm$^{-3}$.

Figure 10C:
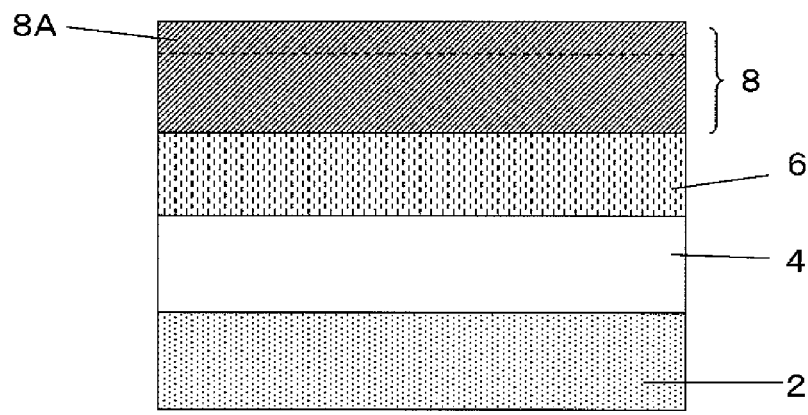
FIG. 10C is a sectional view illustrating another modification example of the gallium nitride-based compound semiconductor light-emitting element according to the first embodiment of the present invention.

In a structure illustrated in FIG. 10C, a heavily Mg-doped region 8A which is doped with Mg at a concentration higher than $9.0 \times 10^{18}$ cm$^3$ is provided in a region that is at a distance of more than 45 nm from the active layer. A p-type electrode, although omitted from FIG. 10C, is provided on a surface of the p-type GaN-based compound semiconductor layer 8. In this embodiment, for the purpose of lowering contact resistance, the heavily Mg-doped region 8A is provided on the surface side of the p-type GaN-based compound semiconductor layer 8, namely, the p-type electrode side, and is in contact with the p-type electrode. The p-type overflow suppressing layer 6 is provided in FIG. 10C but does not always need to be provided.

When the heavily Mg-doped region 8A (a region doped with Mg at a concentration higher than $9.0 \times 10^{18}$ cm$^{-3}$) is provided in the p-type GaN-based compound semiconductor layer 8 in this embodiment, the thickness of the heavily Mg-doped region 8A is set to 10 nm or more because, if the heavily Mg-doped region 8A is less than 10 nm in thickness, there is a fear that contact resistance between the heavily Mg-doped region 8A and the p-type electrode may not be lowered sufficiently. The thickness of the heavily Mg-doped region 8A is also set to 100 nm or less because the heavily Mg-doped region 8A that is thicker than 100 nm may absorb light emitted from the active layer to a degree that lowers the luminous efficacy.

Thus, in an embodiment of the present disclosure, the Mg concentration in the p-type layer does not need to be uniform in the thickness direction, and may change continuously or in stages. In this case, the Mg concentration is adjusted to $1.0 \times 10^{18}$ cm$^{-3}$ to $9.0 \times 10^{18}$ cm$^{-3}$ in at least a range of 45 nm or less in the layer thickness direction from the active layer.

The light-emitting element of this embodiment may further include an undoped spacer layer between the active layer 4 and the p-type GaN-based compound semiconductor layer 8. However, it is preferred from the viewpoint of lowering the electric resistance to keep the active layer 4 and the p-type GaN-based compound semiconductor layer 8 in contact with each other.

The structures of FIGS. 10A and 10B can be manufactured with ease by a manufacturing method described later.

Second Embodiment

A gallium nitride-based compound semiconductor light-emitting element according to a second embodiment of the present invention is described with reference to FIG. 10D.

A crystal growing substrate 101 used in this embodiment is a substrate on which an m-plane gallium nitride (GaN) can be grown. An free-standing substrate that has an m-plane gallium nitride as its own surface is most desirable, but an m-plane substrate of a silicon carbide (SiC) having a 4H or 6H structure which is close in terms of lattice constant may also be employed. The crystal growing substrate 101 may also be a sapphire substrate having an m-plane as a surface. However, in the case where a substance that is not a gallium nitride-based compound semiconductor is used as a substrate, an appropriate intermediate layer or buffer layer needs to be inserted between the substrate and a gallium nitride-based compound semiconductor layer that is formed thereon by deposition.

MOCVD is used to form by deposition gallium nitride-based compound semiconductors including an In$_x$Ga$_{1-x}$N ($0<x<1$) layer.

The substrate 101 is washed with a sulfuric acid-hydrogen peroxide mixture solution and a buffered hydrofluoric acid (BHF) solution which have been heated. The substrate is then washed well with water and dried. After the washing, the substrate is put in a reactor of an MOCVD apparatus in a manner that avoids a contact with the air as much as possible.

Thereafter, hydrogen and nitrogen are introduced as carrier gas, and the substrate is heated to 850° C. while ammonia (NH$_3$) which is a Group V raw material is supplied to perform cleaning on a surface of the substrate.

Still using hydrogen and nitrogen as carrier gas, trimethyl gallium (TMG) or triethyl gallium (TEG) and silane (SiH$_4$) are supplied and the substrate is heated to approximately 1100° C. to form by deposition an n-GaN layer 102. Silane is a raw material gas for providing silicon (Si), which is an n-type dopant.

Next, the supply of SiH$_4$ is stopped, the carrier gas is switched to nitrogen alone, and the substrate temperature is lowered to below 800° C. to form a GaN barrier layer 103 by deposition.

Trimethyl indium (TMI) is started to be supplied to form an In$_x$Ga$_{1-x}$N ($0<x<1$) well layer 104 by deposition. Desirably, the thickness of the In$_x$Ga$_{1-x}$N ($0<x<1$) well layer 104 is typically 5 nm or more and the GaN barrier layer 103 has a thickness suited to the thickness of the In$_x$Ga$_{1-x}$N ($0<x<1$) well layer 104. Three or more GaN barrier layers 103 and three or more In$_x$Ga$_{1-x}$N ($0<x<1$) well layers 104 are alternately formed by deposition to form a GaN/InGaN multiple quantum well active layer 105, which is a light-emitting portion. The cycle of alternation is repeated 3 times or more in total because, as the number of In$_x$Ga$_{1-x}$N ($0<x<1$) well layers 104 becomes larger, the volume for capturing carriers that contribute to radiative recombination becomes greater and the efficiency of the element is accordingly enhanced.

In m-plane growth, increasing the thickness of an InGaN well layer is effective in increasing the volume for capturing carriers. Increasing the thickness of an InGaN well layer which constitutes a light-emitting portion is difficult in conventional c-plane growth, where the quantum-confined Stark effect cannot be ignored. This is because, in order to neutralize the quantum-confined Stark effect as much as possible, the thickness of the InGaN well layer needs to be reduced to a certain degree, typically, to 5 nm or less. In m-planes and other non-polar planes, on the other hand, the quantum-confined Stark effect is not caused in the first place, and the InGaN well layer does not need to be thin. If the well layer is too thick, the strain may become large enough to cause crystal defects. The well layer thickness is set here to 7 nm or more and 18 nm or less.

After the GaN/InGaN multiple quantum well active layer 105 is formed, the supply of TMI is stopped and the supply of hydrogen is resumed to be added to nitrogen gas as carrier gas. The growth temperature is raised to 850° C. to 1000° C., trimethyl aluminum (TMA) is supplied, and biscyclopentadienyl magnesium (Cp$_2$Mg) is supplied as a raw material of Mg, which is a p-type dopant, to form by deposition a p-AlGaN overflow suppressing layer 106.

Next, the supply of TMA is stopped and a p-GaN layer 107 is formed by deposition. At the time the p-AlGaN overflow suppressing layer 106 and the p-GaN layer 107 are formed by deposition, various growth conditions including the Cp$_2$Mg supply amount and the TMG supply amount are adjusted so that the concentration of Mg contained in the two layers is within a range of $1.0 \times 10^{18}$ cm$^{-3}$ to $9.0 \times 10^{18}$ cm$^{-3}$, desirably $2.0 \times 10^{18}$ cm$^{-3}$ to $8.0 \times 10^{18}$ cm$^{-3}$, more desirably $3.0 \times 10^{18}$ cm$^{-3}$ to $7.0 \times 10^{18}$ cm$^{-3}$. Desirably, the Mg concentration is kept within the above range by controlling the Cp$_2$Mg supply amount with the growth temperature set to 850° C. to 1000° C. and the TMG supply amount kept constant.

The p-GaN layer 107 in this embodiment is an m-plane semiconductor layer formed by m-plane growth. An m-plane nitride-based layered semiconductor structure is obtained typically by using an m-plane GaN substrate and growing a semiconductor on an m-plane of the substrate as in this embodiment. This is because the plane orientation of the surface of the GaN-based substrate is reflected on the plane orientation of the layered semiconductor structure. However, in light of reported cases where a-plane GaN grows on an r-plane sapphire substrate, the principal surface of the GaN substrate 101 does not always need to be an m-plane depending on growth conditions. It is also not necessary to leave the substrate in the final element. In the structure of the present disclosure, it is sufficient if at least the p-GaN layer 107 is an m-plane layer.

Figure 5:
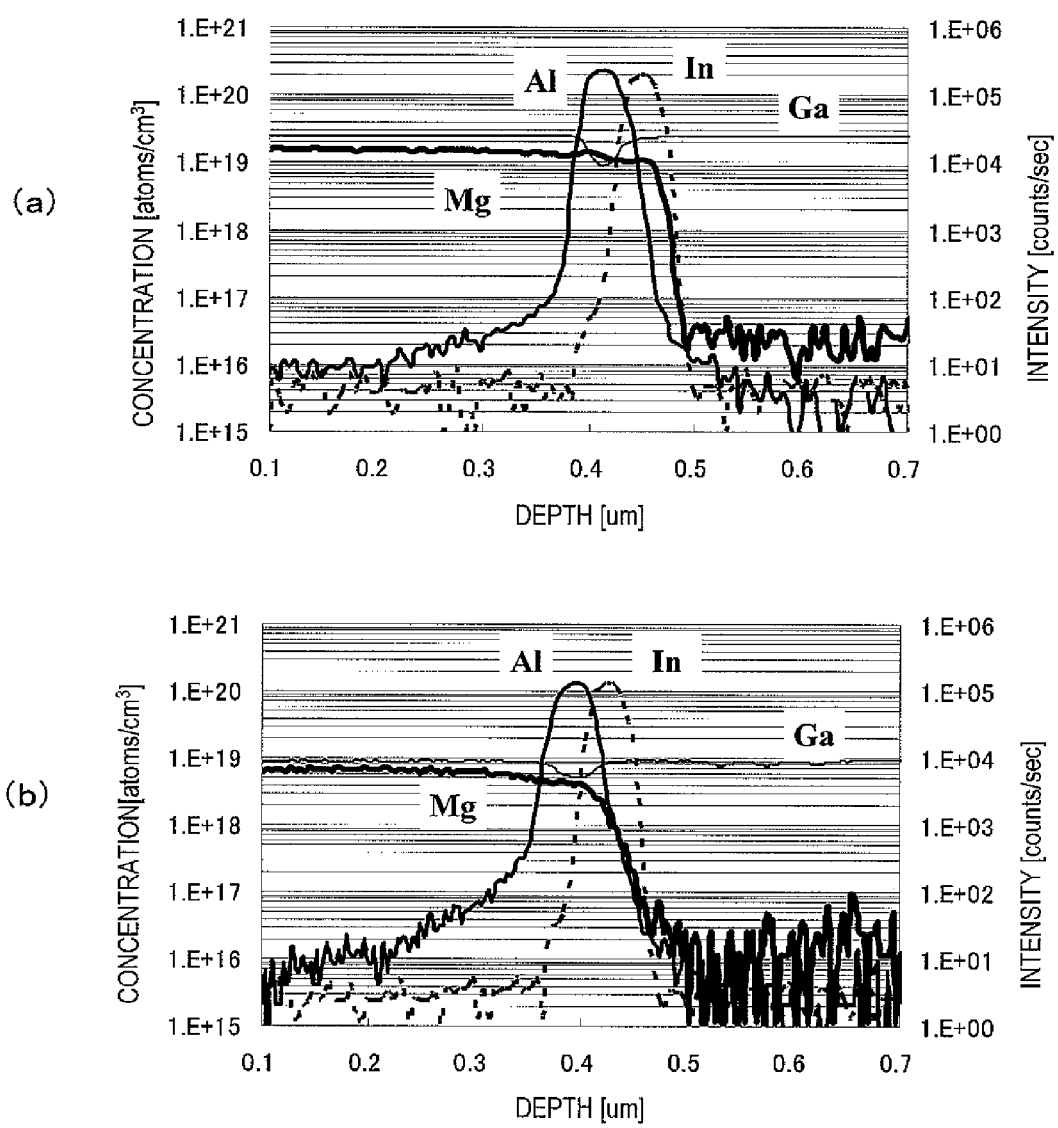
FIGS. 5(*a*) and 5(*b*) are graphs showing SIMS analysis results of LED samples.

FIG. 5 clearly show that the diffusion occurs even in an m-plane growth p-type layer if the Mg concentration is $1.5 \times 10^{19}$ cm$^{-3}$. According to results of a study conducted by the inventors of the present invention (FIGS. 6 and 7B), the decrement of the diffusion penetration length of Mg atoms is large when the Mg concentration is approximately less than $1.0 \times 10^{19}$ cm$^{-3}$. The Mg concentration is therefore required to be $9.0 \times 10^{18}$ cm$^{-3}$ or lower in order to obtain the effects of the present subject matter. As illustrated in FIG. 6, the diffusion penetration length of Mg atoms becomes shorter as the Mg concentration drops also when the Mg concentration ratio is lower than $1.0 \times 10^{19}$ cm$^{-3}$. In view of this, to obtain the effects of the present subject matter in a more favorable manner, the Mg concentration is desirably $8.0 \times 10^{18}$ cm$^{-3}$ or less and more desirably $7.0 \times 10^{18}$ cm$^{-3}$ or less. When the Mg concentration is $7.0 \times 10^{18}$ cm$^{-3}$ or lower, forming the p-type layer by lengthy deposition does not cause the diffusion and the penetration length is substantially zero. This makes it easy to allow a margin for the growth time in controlling the thickness of the p-type layer.

As shown in FIG. 4, the resistivity of the p-type layer increases markedly when the Mg concentration is too low even in the case of m-plane growth. If the Mg concentration is lower than $1.0 \times 10^{18}$ cm$^{-3}$, the resistivity exceeds 5.0 Ωcm and the resultant operating voltage is not suitable for a light-emitting element. The Mg concentration is therefore desirably $1.0 \times 10^{18}$ cm$^{-3}$ or higher, more desirably $2.0 \times 10^{18}$ cm$^{-3}$ or higher at which the resistivity is below 3.0 Ωcm, and most desirably $3.0 \times 10^{18}$ cm$^{-3}$ or higher at which the resistivity is below 2.0 Ωcm.

The p-AlGaN overflow suppressing layer 106 is a layer inserted for the purpose of preventing n-type carriers (electrons) which are injected from the side of the n-GaN layer 102 from passing through toward the p-type layer side without contributing to radiative recombination in the GaN/InGaN multiple quantum well active layer 105. The p-GaN layer 107 is desirably formed by deposition by controlling conditions so that the thickness of the p-GaN layer 107 is within a range of 50 to 800 nm.

Annealing is performed on the substrate taken out of the reactor to detach hydrogen atoms that have been introduced into the p-AlGaN overflow suppressing layer 106 and the p-GaN layer 107.

Next, a photolithography process and an etching process are performed to remove only a given region of the p-GaN layer 107, the p-AlGaN overflow suppressing layer 106, and the GaN/InGaN multiple quantum well active layer 105, and expose a part of the n-GaN layer 102. An n-type electrode 108 constituted of a Ti/Al layer or the like is formed in the exposed region of the n-GaN layer 102. A p-type electrode 109 constituted of a Pd/Pt layer or the like is formed in a given region on the p-GaN layer 107.

Figure 10D:
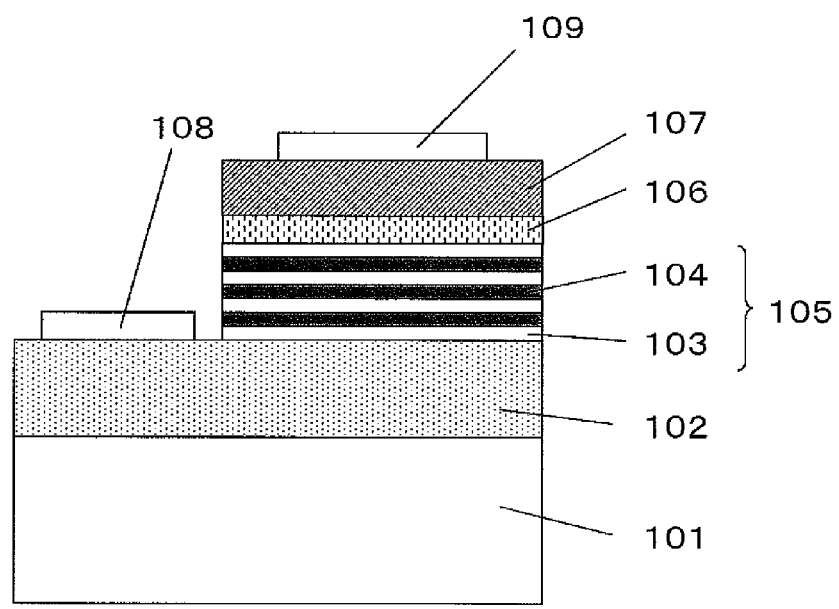
FIG. 10D is a sectional view illustrating a gallium nitride-based compound semiconductor light-emitting element according to a second embodiment of the present invention.

The light-emitting element of this embodiment illustrated in FIG. 10D is manufactured through the process described above. According to the light-emitting element of this embodiment, a voltage applied between the n-type electrode 108 and the p-type electrode 109 causes an injection of n-type carriers and p-type carriers into the GaN/InGaN multiple quantum well active layer 105, which emits light through recombination.

EXAMPLES AND COMPARATIVE EXAMPLES

Table 1 shows results of analyzing samples that were prepared by manufacturing the light-emitting element of the first embodiment under various conditions.

TABLE 1

| Sample number | Plane orientation | | p-GaN layer Mg concentration [cm$^{-3}$] | p-GaN layer deposition time [min] | Mg atom penetration length [nm] | Room temperature PL intensity [a·u] | Operating voltage @20 mA[V] |
|---|---|---|---|---|---|---|---|
| 1 | M | x | $1.5 \times 10^{19}$ | 70 | 60 | Equal | 3.79 |
| 2 | M | x | $6.5 \times 10^{18}$ | 70 | 10 | 8 to 10 times | 3.87 |
| 3 | C | x | $6.5 \times 10^{18}$ | 70 | 10 | 3 to 6 times | 5.67 |
| 4 | M | x | $2.5 \times 10^{18}$ | 70 | 5 | 8 to 10 times | 4.09 |
| 5 | M | o | $1.5 \times 10^{19}$ | 70 | 60 | 5 to 7 times | 4.81 |
| 6 | M | x | $1.5 \times 10^{19}$ | 35 | 30 | 2 to 3 times | 3.80 |

In the GaN/InGaN multiple quantum well active layer 105, three InGaN well layers 104 each having a thickness of 3 nm and three GaN barrier layers 103 each having a thickness of 7 nm were alternately formed. Some of the samples include an un-GaN spacer layer having a thickness of 80 nm which is inserted between the GaN/InGaN multiple quantum well active layer 105 and the p-AlGaN overflow suppressing layer 106. For comparison, c-plane growth samples were also prepared.

To evaluate the samples, a PL intensity measurement was performed at room temperature with an He—Cd laser for excitation at a wavelength of 325 nm as an excitation light source, and a voltage was measured at the time a current of 20 mA was injected into a simplified electrode. The penetration length of Mg atoms is a value obtained from results of an SIMS analysis.

Sample 1

Comparative Example 1

The penetration length of Mg atoms was approximately 60 nm when the Mg concentration of the p-GaN layer 107 formed by m-plane growth was $1.5 \times 10^{19}$ cm$^{-3}$ and the growth time of the p-GaN layer was 70 minutes. The un-GaN spacer layer was not inserted in the sample and some of Mg atoms were consequently distributed in substantially the entire area of the GaN/InGaN multiple quantum well active layer 105. The luminous efficacy of the element dropped markedly as a result. Table 1 uses the PL intensity in this case as a reference value 1.0.

Sample 2

Example 1

The penetration length of Mg atoms was approximately 10 nm when the Mg concentration of the p-GaN layer 107 was $6.5 \times 10^{18}$ cm$^{-3}$ even though the growth time of the p-GaN layer 107 was 70 minutes. Mg atoms therefore did not reach the GaN/InGaN multiple quantum well active layer 105 despite the absence of the un-GaN spacer layer. The PL intensity of Sample 2 was approximately 8 to 10 times larger than that of Sample 1. In addition, because the Mg concentration of the p-GaN layer 107 was $6.5 \times 10^{18}$ cm$^{-3}$, a rise in operating voltage due to an increase in resistivity was relatively small. The difference between the operating voltage of Sample 2 and the operating voltage of Sample 1 which was lowest among the samples shown in Table 1 was less than 0.1 V.

Sample 3

Comparative Example 2

Sample 3 is a p-GaN layer that has the same Mg concentration as that of the p-GaN layer 107 of Sample 2 and that is manufactured by c-plane growth. In Sample 3, Mg atoms were hardly diffused as in the m-plane growth of Sample 2, but the operating voltage was much higher. This is presumably because the resistivity of the p-GaN layer 107 is very high in c-plane growth as shown in FIG. 4.

Sample 4

Example 2

The penetration length of Mg atoms was less than 5 nm when the Mg concentration of the p-GaN layer 107 was $2.5 \times 10^{18}$ cm$^{-3}$ even though the growth time of the p-GaN layer 107 was 70 minutes. Mg atoms therefore did not reach the GaN/InGaN multiple quantum well active layer 105 despite the absence of the un-GaN spacer layer. The PL intensity was approximately 8 to 10 times larger than that of Sample 1 as in the PL intensity of Sample 2. The operating voltage was slightly higher. This is presumably because the resistivity of the p-GaN layer 107 was higher. The operating voltage of Sample 4 remained at a level that makes the sample perfectly useable as a light-emitting element.

Sample 5

Comparative Example 3

Sample 5 has the structure of Sample 1 to which the un-GaN spacer layer is inserted. In this case, Mg atoms do not reach the GaN/InGaN multiple quantum well active layer 105. The luminous efficacy of the element was therefore not lowered and the PL intensity was 5 to 7 times larger than that of Sample 1. However, the operating voltage was 4.81 V due to the presence of the un-GaN spacer layer.

Sample 6

Comparative Example 4

Sample 6 has the same structure as that of Sample 1, except that the growth time of the p-GaN layer 107 is half the growth time in Sample 1. In Sample 6, too, the penetration length of Mg atoms was reduced to approximately 30 nm. The amount of Mg atoms that turned into non-radiative centers was accordingly smaller and the lowering of the luminous efficacy was reduced. However, the PL intensity of Sample 6 was only 2 to 3 times larger than the PL intensity of Sample 1, and the obtained effect was unsatisfactory compared to Sample 2, where the Mg concentration was lowered to $6.5 \times 10^{18}$ cm$^{-3}$.

A comparison among Samples 1 to 5 reveals that setting the Mg concentration to $6.5 \times 10^{18}$ cm$^{-3}$ suppresses the diffusion of Mg atoms to the GaN/InGaN multiple quantum well active layer 105 and prevents the luminous efficacy of the element from dropping. According to Examples of the present disclosure, the need to insert the un-GaN spacer layer is eliminated and a significant rise in operating voltage can be avoided.

Examples of the present disclosure also do not need to provide a layer doped with Si for the purpose of suppressing the diffusion of Mg. Therefore, the efficiency in injecting holes into the GaN/InGaN multiple quantum well active layer 105 from the p-GaN layer 107 is not lowered as well.

While setting the Mg concentration low impairs electrical characteristics markedly in a c-plane growth p-GaN layer, setting the Mg concentration to an appropriately low level does not invite the deterioration of electrical characteristics in m-plane growth. The phenomenon in which the activation rate of Mg is higher in m-plane growth than in c-plane growth has been unexpected and the exact cause is unclear.

A surface (principal surface) of an actual m-plane semiconductor layer does not need to be a plane that is completely parallel to an m-plane, and may be inclined at a slight angle (larger than 0° and less than ±1°) from the m-plane. Forming a substrate or a semiconductor layer that has a surface completely parallel to an m-plane is difficult in terms of manufacturing technology. An actual surface of an m-plane substrate or an m-plane semiconductor layer that is formed by the current manufacturing technology is therefore inclined from the ideal m-plane. The angle and direction of inclination vary depending on the manufacturing process, and controlling the angle and direction of inclination with accuracy is accordingly difficult.

In some cases, a surface (principal surface) of a substrate or a semiconductor is intentionally inclined at an angle of 1° or more from an m-plane. In an embodiment described below, a surface (principal surface) of a p-type gallium nitride-based compound semiconductor layer is intentionally inclined at an angle of 1° or more from an m-plane.

Another Embodiment

A gallium nitride-based compound semiconductor light-emitting element according to this embodiment includes a p-type gallium nitride-based compound semiconductor layer whose principal surface is a surface inclined at an angle of 1° or more from an m-plane. Except this point, the structure of this embodiment is the same as the structure of the second embodiment which is illustrated in FIG. 10D.

In the gallium nitride-based compound semiconductor light-emitting element according to this embodiment, the principal surface of the substrate 101 illustrated in FIG. 10D is inclined at an angle of 1° or more from the m-plane. A substrate such as this substrate 101 is commonly referred to as "off substrate". An off substrate can be manufactured by slicing a substrate out of a single-crystal ingot and setting as a principal surface a surface that is intentionally inclined in a specific direction from an m-plane in the process of polishing the surface of the substrate. When various semiconductor layers are stacked on a principal surface of a substrate that is inclined in this manner, the surfaces (principal surfaces) of these semiconductor layers are inclined from the m-plane as well.

Described next in detail with reference to FIG. 11 is the slant of the p-type GaN-based compound semiconductor layer in this embodiment.

Figure 1:
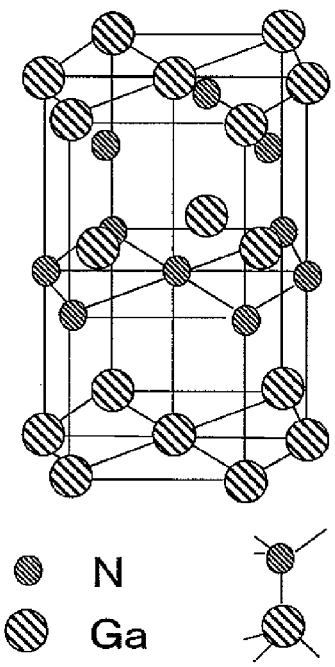
FIG. 1 is a perspective view schematically illustrating the unit cell of GaN.
Figure 2:
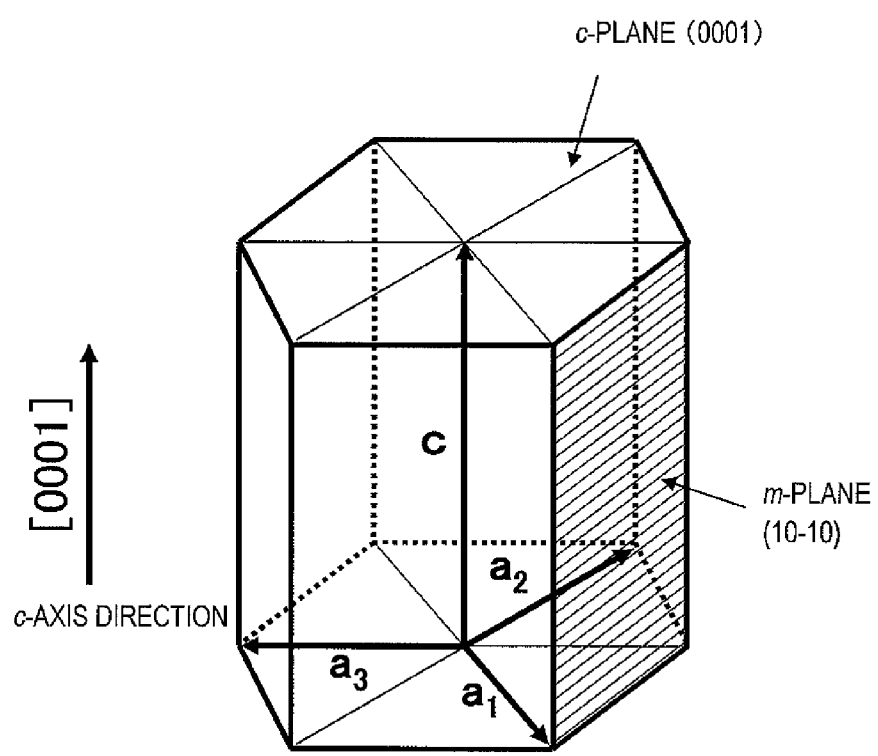
FIG. 2 is a perspective view illustrating fundamental vectors, $a_1$, $a_2$, $a_3$, and c of a wurtzite crystal structure.

FIG. 11(a) is a diagram schematically illustrating the crystal structure (wurtzite crystal structure) of a GaN-based compound semiconductor, and illustrates a structure obtained by rotating the direction of the crystal structure of FIG. 2 by 90°. In a GaN crystal, c-planes include a +c-plane and a −c-plane. The +c-plane is a (0001) plane where Ga atoms appear on the surface and is called a "Ga plane". The −c-plane, on the other hand, is a (000-1) plane where n (nitrogen) atoms appear on the surface, and is called an "N plane". The +c-plane and the −c-plane are parallel to each other and are each perpendicular to the m-plane. While c-planes which have polarities can be separated into a +c-plane and a −c-plane, there is no sense in separating a-planes, which are non-polar planes, into a +a-plane and a −a-plane.

A +c-axis direction illustrated in FIG. 11(a) is a direction that runs perpendicularly from the −c-plane to the +c-plane. An a-axis direction corresponds to the unit vector $a_2$ of FIG. 2, and is in a [−12-10] direction parallel to the m-plane. FIG. 11(b) is a perspective view illustrating an interrelation between the normal line of the m-plane, the +c-axis direction, and the a-axis direction. The normal line of the m-plane is parallel to a [10-10] direction and, as illustrated in FIG. 11(b), perpendicular to the +c-axis direction and the a-axis direction both.

Slanting the principal surface of the GaN-based compound semiconductor layer at an angle of 1° or more from the m-plane means that the normal line of the principal surface of this semiconductor layer is inclined at an angle of 1° or more from the normal line of the m-plane.

Next, reference is made to FIGS. 12(a) and 12(b) which are each a sectional view illustrating a relation between a principal surface of a GaN-based compound semiconductor layer and an m-plane. The drawings are sectional views perpendicular to an m-plane and a c-plane both. FIGS. 12(a) and 12(b) include an arrow that indicates a +c-axis direction. As illustrated in FIGS. 11(a) and 11(b), the m-plane is parallel to the +c-axis direction. A normal vector of the m-plane is therefore perpendicular to the +c-axis direction.

In the examples of FIGS. 12(a) and 12(b), a normal vector of the principal surface in the GaN-based compound semiconductor layer is inclined from the normal vector of the m-plane in a c-axis direction. To give a more detailed description, the normal vector of the principal surface is inclined toward the +c-plane side in the example of FIG. 12(a), whereas the normal line of the principal surface is inclined toward the −c-plane side in the example of FIG. 12(b). Herein, the angle of inclination of the normal vector of the principal surface with respect to the normal vector of the m-plane (inclination angle θ) takes a positive value in the former case, and the inclination angle θ takes a negative value in the latter case. In either case, it can be said that "the principal surface is inclined in a c-axis direction".

Figure 13:
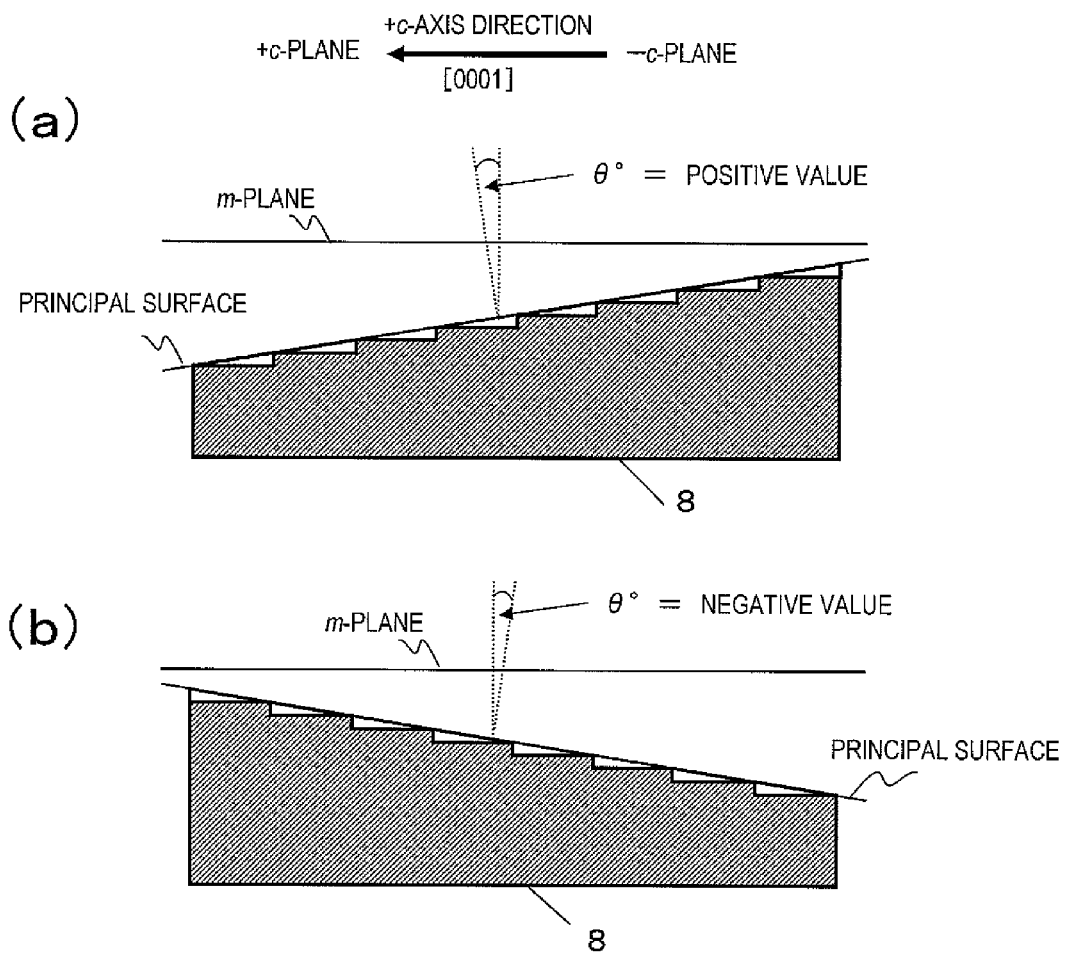
FIGS. 13(a) and 13(b) are each a sectional view schematically illustrating a principal surface of a p-type GaN-based compound semiconductor layer 8 and a region near the principal surface.

When the inclination angle is 1° or more and 5° or less and when the inclination angle is −5° or more and −1° or less, this embodiment provides the same effects of the present subject matter that are obtained when the inclination angle is larger than 0° and less than ±1°. The reason thereof is described below with reference to FIGS. 13(a) and 13(b). FIGS. 13(a) and 13(b) are sectional views corresponding to FIGS. 12(a) and 12(b), respectively, and each illustrate a region near the principal surface of the p-type GaN-based compound semiconductor layer 8 that is inclined in a c-axis direction from the m-plane. When the inclination angle θ is 5° or less, a plurality of steps is formed on the principal surface of the p-type GaN-based compound semiconductor layer 8 as illustrated in FIGS. 13(a) and 13(b). The steps are each as tall as a monoatomic layer (2.7 Å), and are arranged parallel to one another at substantially equal intervals (30 Å or more). A principal surface that is overall inclined from an m-plane is formed from the steps arranged in this manner. Microscopically, the steps can be viewed as a large number of exposed m-plane regions. A surface of a GaN-based compound semiconductor layer whose principal surface is inclined from an m-plane takes this structure because m-planes are very stable as crystal planes to begin with.

It is inferred that the same phenomenon occurs when the direction in which the normal vector of the principal surface is inclined is in other plane orientations than those of the +c-plane and the −c-plane. The same will apply to a case where the normal vector of the principal surface is inclined in, for example, an a-axis direction, if the inclination angle is 1° or more and 5° or less.

Therefore, an operating voltage satisfactorily low for a light-emitting element is accomplished also by a p-type gallium nitride-based compound semiconductor layer whose principal surface is a plane inclined at an angle of 1° or more and 5° or less from an m-plane in an arbitrary direction, if the layer is doped with Mg at a concentration of $1.0 \times 10^{18}$ cm$^{-3}$ to $9.0 \times 10^{18}$ cm$^{-3}$. The diffusion of Mg to the active layer can thus be prevented in the first place. Because non-radiative centers in the active layer are kept from increasing and the absorption of light by the p-type layer is reduced at the same time, the luminous efficacy of the element is prevented from deteriorating.

If the absolute value of the inclination angle θ is larger than 5°, the internal quantum efficiency drops due to a piezoelectric field. When the generation of the piezoelectric field has too large an impact, the significance of implementing a semiconductor light-emitting element by m-plane growth decreases. The absolute value of the inclination angle θ is therefore limited to 5° or less in the present disclosure. However, the inclination angle θ set to, for example, 5° may deviate from 5° by about ±1° in practice due to manufacturing fluctuations. Eliminating this and other manufacturing fluctuations completely is difficult, and an angle deviation as small as this does not negate the effects of the present invention.

INDUSTRIAL APPLICABILITY

A semiconductor light-emitting element of the present disclosure accomplishes low power consumption while suppressing the diffusion of Mg atoms from a p-type gallium nitride-based compound semiconductor to an active layer

REFERENCE SIGNS LIST 101 crystal growing substrate
102 n-GaN layer
103 GaN barrier layer
104 $In_xGa_{1-x}N$ (0<x<1) well layer
105 GaN/InGaN multiple quantum well active layer
106 p-AlGaN overflow suppressing layer
107 p-GaN layer
108 n-type electrode
109 p-type electrode

The invention claimed is:

1. A gallium nitride-based compound semiconductor light-emitting element, comprising:
    an n-type gallium nitride-based compound semiconductor layer;
    a p-type gallium nitride-based compound semiconductor layer;
    an active layer, which is located between the n-type gallium nitride-based compound semiconductor layer and the p-type gallium nitride-based compound semiconductor layer;
    a p-type overflow suppressing layer, which is located between the p-type gallium nitride-based compound semiconductor layer and the active layer; and
    a p-type electrode, which is in contact with the p-type gallium nitride-based compound semiconductor layer,
    wherein the p-type gallium nitride-based compound semiconductor layer comprises a semiconductor layer that is inclined at an angle of 1° or more from an m-plane, and an angle formed between a normal line of a principal surface of the p-type gallium nitride-based compound semiconductor layer and a normal line of the m-plane is 1° or more and 5° or less,
    wherein the p-type gallium nitride-based compound semiconductor layer comprises a GaN layer,
    wherein the p-type gallium nitride-based compound semiconductor layer is in contact with the p-type overflow suppressing layer,
    wherein the p-type gallium nitride-based compound semiconductor layer includes a heavily doped region, which is doped with Mg at a concentration higher than $9.0 \times 10^{18}$ $cm^{-3}$, and other regions than the heavily doped region,
    wherein the heavily doped region is provided on the p-type electrode side to have a thickness of 10 nm or more and 100 nm or less, and
    wherein the other regions than the heavily doped region are doped with Mg at a concentration of $1.0 \times 10^{18}$ $cm^{-3}$ or more and $9.0 \times 10^{18}$ $cm^{-3}$ or less.

2. The gallium nitride-based compound semiconductor light-emitting element of claim 1, wherein the p-type gallium nitride-based compound semiconductor layer comprises a semiconductor layer inclined in a c-axis direction or an a-axis direction.

3. The gallium nitride-based compound semiconductor light-emitting element of claim 1, wherein the p-type overflow suppressing layer is doped with Mg at a concentration of $1.0 \times 10^{18}$ $cm^{-3}$ or more and $9.0 \times 10^{18}$ $cm^{-3}$ or less.

4. The gallium nitride-based compound semiconductor light-emitting element of claim 1, wherein a portion of the p-type gallium nitride-based compound semiconductor layer that is at a distance of 45 nm or less from the active layer has an Mg concentration of $1.0 \times 10^{18}$ $cm^{-3}$ or more and $9.0 \times 10^{18}$ $cm^{-3}$ or less.

5. The gallium nitride-based compound semiconductor light-emitting element of claim 1, further comprising an undoped spacer layer, which is interposed between the active layer and the p-type overflow suppressing layer.

6. The gallium nitride-based compound semiconductor light-emitting element of claim 1, wherein the active layer and the p-type overflow suppressing layer are in contact with each other.

7. A gallium nitride-based compound semiconductor light-emitting element, comprising:
    an n-type gallium nitride-based compound semiconductor layer;
    a p-type gallium nitride-based compound semiconductor layer;
    an active layer, which is located between the n-type gallium nitride-based compound semiconductor layer and the p-type gallium nitride-based compound semiconductor layer; and
    a p-type electrode, which is in contact with the p-type gallium nitride-based compound semiconductor layer,
    wherein the p-type gallium nitride-based compound semiconductor layer comprises a semiconductor layer that is inclined at an angle of 1° or more from an m-plane, and an angle formed between a normal line of a principal surface of the p-type gallium nitride-based compound semiconductor layer and a normal line of the m-plane is 1° or more and 5° or less,
    wherein the p-type gallium nitride-based compound semiconductor layer comprises a GaN layer,
    wherein the active layer and the p-type gallium nitride-based compound semiconductor layer are in contact with each other,
    wherein the p-type gallium nitride-based compound semiconductor layer includes a heavily doped region, which is doped with Mg at a concentration higher than $9.0 \times 10^{18}$ $cm^{-3}$, and other regions than the heavily doped region,
    wherein the heavily doped region is provided on the p-type electrode side to have a thickness of 10 nm or more and 100 nm or less, and
    wherein the other regions than the heavily doped region are doped with Mg at a concentration of $1.0 \times 10^{18}$ $cm^{-3}$ or more and $9.0 \times 10^{18}$ $cm^{-3}$ or less.

8. The gallium nitride-based compound semiconductor light-emitting element of claim 7, wherein a portion of the p-type gallium nitride-based compound semiconductor layer that is at a distance of 45 nm or less from the active layer has an Mg concentration of $2.0 \times 10^{18}$ $cm^{-3}$ or more and $8.0 \times 10^{18}$ $cm^{-3}$ or less.

* * * * *